(12) United States Patent
Hornung et al.

(10) Patent No.: US 7,061,760 B2
(45) Date of Patent: Jun. 13, 2006

(54) MEMORY COOLER

(75) Inventors: Craig Warren Hornung, Harrisburg, PA (US); Jim Leidy, Hummelstown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 133 days.

(21) Appl. No.: 10/894,246

(22) Filed: Jul. 19, 2004

(65) Prior Publication Data

US 2006/0012956 A1    Jan. 19, 2006

(51) Int. Cl.
*H05K 7/20* (2006.01)

(52) U.S. Cl. ............... 361/695; 361/684; 361/690; 361/694; 361/715; 361/716; 361/721; 257/721; 174/16.1; 165/80.3; 165/104.33

(58) Field of Classification Search ............. 361/695, 361/715–716; 174/16.1; 165/80.3, 104.33; 257/721

See application file for complete search history.

(56) References Cited

U.S. PATENT DOCUMENTS

| | | | |
|---|---|---|---|
| 5,218,514 A * | 6/1993 | Huynh et al. | 361/683 |
| 5,428,503 A * | 6/1995 | Matsushima et al. | 361/695 |
| 5,734,551 A * | 3/1998 | Hileman et al. | 361/695 |
| 5,917,698 A | 6/1999 | Viallet | 361/695 |
| 6,130,820 A * | 10/2000 | Konstad et al. | 361/695 |
| 6,421,240 B1 * | 7/2002 | Patel | 361/699 |
| 6,654,247 B1 | 11/2003 | Lee | 361/697 |
| 6,711,021 B1 * | 3/2004 | Morris | 361/721 |

* cited by examiner

Primary Examiner—Boris Chervinsky

(57) ABSTRACT

An apparatus for cooling memory modules installed in adjacent sockets on a circuit board is provided. The apparatus includes a fan for directing cooling air through air gaps between adjacent memory modules. The air gaps extend in a longitudinal direction from a first end of the modules to an opposite second end of the modules. The cooling air in adjacent air gaps moves in opposite directions from the first end of the memory modules to the second end of the memory modules.

20 Claims, 3 Drawing Sheets

MEMORY COOLER

BACKGROUND OF THE INVENTION

The invention relates generally to the cooling of electronic modules, and more particularly, to the cooling of memory modules within computer devices.

Computers may include numerous types of memory modules such as Dynamic Random Access Memory (DRAM), Synchronous Dynamic Random Access Memory (SDRAM), Extended Data Out Random Access Memory (EDO RAM), and the like. The memory modules are produced in a number of formats such as, for example, Single In-line Memory Modules (SIMM's), or the newer Dual In-line Memory Modules (DIMM's).

Typically, the memory modules are installed in one or more multi-pin sockets mounted on a system board or motherboard. As computers and servers have become faster and more powerful, there has also been a demand for more and faster memory.

The memory modules commonly used in today's personal computers and server applications typically do not generate so much heat that they require cooling from a heat dissipation device. New memory modules, however, such as dual data rate (DDR), dual data rate II (DDR II), and buffered DDR II memory modules produce significantly more heat, which requires a heat dissipation system to cool the modules. Furthermore, standards developed for the new memory modules allow for the memory modules to be stacked closer together and also to be stacked vertically on top of one another. Shortening the distance between the memory modules enhances communication speeds between the modules; however, excess heat build up can degrade signal speed and signal integrity.

It is desirable that a cooling system be provided that does not enlarge the footprint allotted for memory in the computer or server. This is of significant concern in the case of blade servers or modular, single board computers that are rack mounted or drawer mounted.

A need exists for a memory module cooling device that can provide cooling for memory modules while preserving space in the computer or server.

BRIEF DESCRIPTION OF THE INVENTION

In one aspect, an apparatus for cooling memory modules installed in adjacent sockets on a circuit board is provided. The apparatus includes a fan for directing cooling air through air gaps between adjacent memory modules. The air gaps extend in a longitudinal direction from a first end of the modules to an opposite second end of the modules. The cooling air in adjacent air gaps moves in opposite directions from the first end of the memory modules to the second end of the memory modules.

Optionally, the apparatus includes a housing disposed above the sockets, that has a first end proximate the first end of the memory modules and a second end proximate the second end of the memory modules. A first fan is proximate the first end of the memory modules and a second fan proximate the second end of the memory modules. Each fan has a plurality of stages along an axis transverse to the longitudinal direction of the air gaps, some of the stages delivering cooling air into the air gaps and others of the stages drawing air from the air gaps. The housing also includes a cover that inhibits the escape of cooling from the air gaps in a direction parallel to the plane of the memory modules. The cover also includes a plurality of slots extending parallel to and aligned with the sockets to receive an upper portion of a stacked memory module installed in the sockets. The cooling apparatus can also include a duct delivering cooling air to an inlet of the fan.

In another aspect, an apparatus for cooling memory modules installed in adjacent sockets on the circuit board is provided that includes a housing having a first end and a second end and a body extending therebetween. At least one fan is mounted at one of the first and second ends of the housing, the at least one fan being configured to deliver cooling air through air gaps between adjacent memory modules. The air gaps extend in a longitudinal direction from a first end of the memory modules to an opposite second end of the memory modules. The housing has a maximum length from the first end to the second end that does not exceed a maximum length of the sockets along a longitudinal axis of the sockets.

In another aspect, a socket for a memory module is provided. The socket includes a socket base including a plurality of slots extending between a first end of the base to an opposite second end of the base. Each slot is configured to receive a memory module. A housing is coupled to the socket base, the housing having a first end proximate the first end of the socket base and a second end proximate the second end of the socket base. A fan is proximate one of the first and second ends of the socket base. The fan is configured to direct cooling air longitudinally through air spaces between the slots, the cooling air in adjacent air spaces moving in opposite directions relative to one another from the first of the socket base to the second end of the socket base.

DETAILED DESCRIPTION OF THE INVENTION

Figure 1:
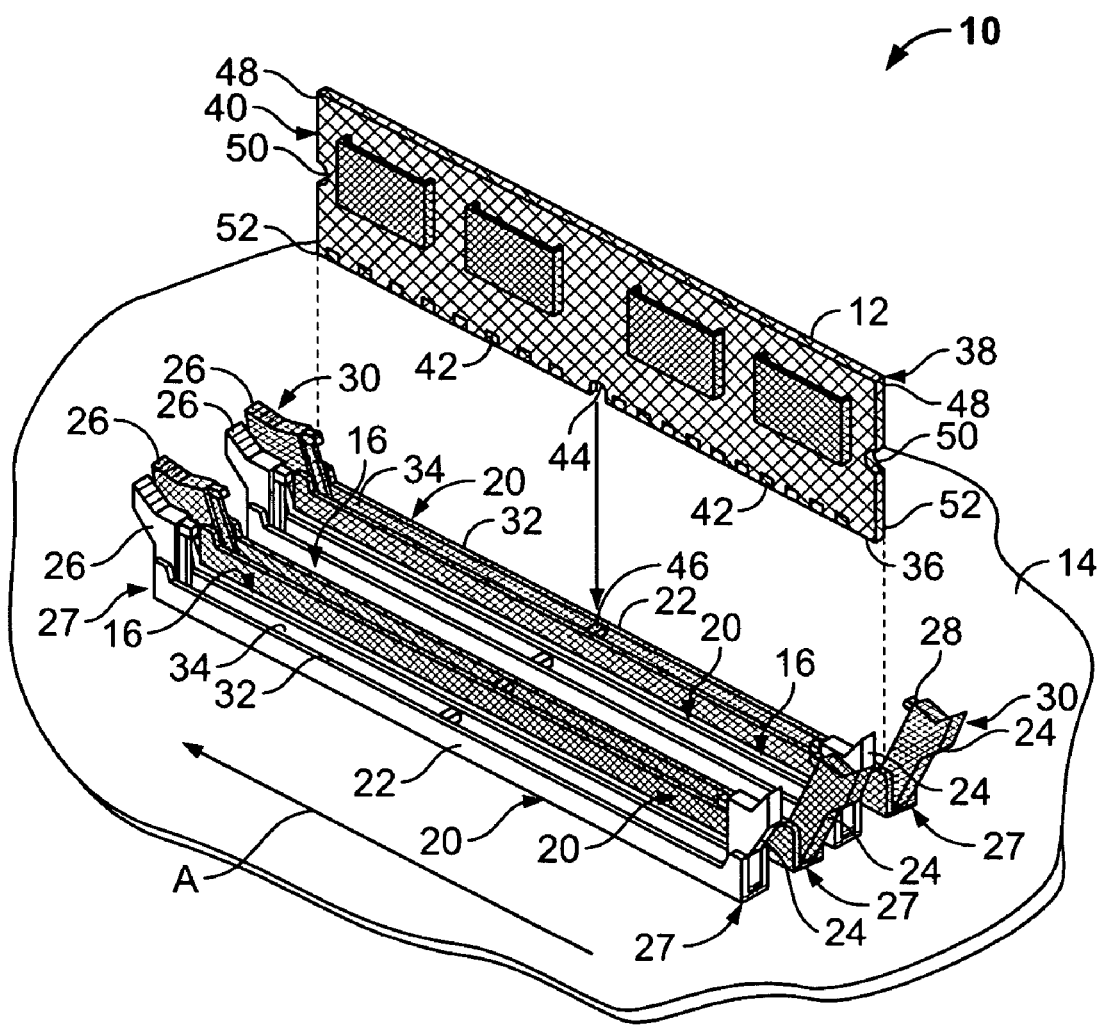
FIG. 1 is a perspective view of a known memory interface for a circuit board.

FIG. 1 illustrate a known memory module interface 10. The interface 10 is used to mount a memory module 12 on a circuit board 14. The memory module interface 10 is used for card edge memory module types such as Single In-Line Memory Modules (SIMM) or Dual In-Line Memory Modules (DIMM) including the newer Dual Data Rate II (DDR II) and Fully Buffered Dual Data Rate II (FB DDR II) memory modules as well. The interface 10 is typically used in both personal computer and server applications. The interface 10 includes a number of memory sockets 20 which interconnect one or more of the memory modules 12 to the circuit board 14. An air space or air gap 16 separates each socket 20 from an adjacent socket 20, and more specifically, the air space or air gap 16 separates each memory module 12 from an adjacent memory module 12 when memory modules are installed in the sockets 20. In FIG. 1, three air gaps 16 are shown between four memory sockets 20. Memory sockets such as socket 20 allow circuit boards, such as motherboards used in computer equipment, to be made in somewhat standard configurations that can accept memory modules such as the memory module 12. The memory module 12 can be manufactured in varying memory capacities, and different modules can be installed in the same memory socket such as the socket 20.

The socket 20 includes a socket base 22 extending along a longitudinal axis A between a first end bracket 24 and a second opposed end bracket 26. The air spaces or air gaps 16 between the sockets 20 also extend along the socket longitudinal axis A. The end brackets 24 and 26 are each pivotally coupled at a pivot end 27 to the socket base 22. Each end bracket 24, 26 includes a latch pin 28 proximate a free end 30 of each end bracket 24 and 26. The socket base 22 includes an upper edge 32 that has a slot 34. The slot 34 extends along the longitudinal axis A of the socket base 22 from the first end bracket 24 to the second end bracket 26. The socket base 22 includes contacts (not shown) which are positioned laterally on both sides of the slot 34. The socket contacts have mounting ends (not shown) that connect with electrical traces (not shown) on the circuit board 14 when the socket 20 is mounted on the circuit board 14. The socket 20 is fabricated from a dielectric material and is typically surface mounted on the circuit board 14 via the contacts using known techniques.

The memory module 12 has a contact mating edge 36 that extends from a first end 38 to an opposite second end 40 and includes a plurality of contact pads 42 distributed along the mating edge 36. The mating edge 36 of the memory module 12 is received in the slot 34 of the socket base 22. The contact pads 42 mate with the socket contacts (not shown) to interconnect the contact pads 42 on the memory module 12 with the electrical traces on the circuit board 14 when the memory module 12 is installed in the socket 20. The mating edge 36 of the memory module 12 also includes a notch 44 that receives a cross bar 46 in the upper edge 32 of the socket base 22. The notch 44 and the cross bar 46 are each offset in the memory module 12 and socket base 22, respectively, to assure proper orientation of the memory module 12 with respect to the socket 20. The memory module 12 includes side edges 48 that each include a notch 50. Lower corners 52 at side edges 48 engage a pivot member (not shown) at the pivot end 27 of the end brackets 24 and 26 when the memory module 12 is inserted into the socket 20. When the memory module 12 is seated in the socket base 22, the end brackets 24 and 26 are pivoted toward the memory module so that the latch pins 28 are received in the side notches 50 of the memory module 12, thereby locking the memory module 12 in the socket 20.

Figure 2:
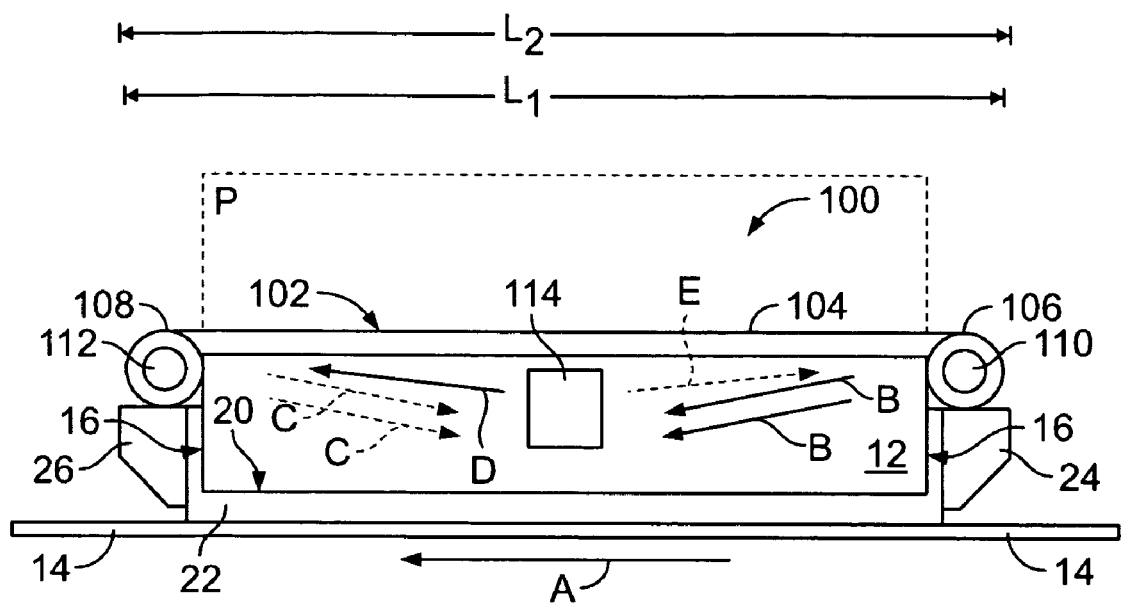
FIG. 2 is a front elevational view of an exemplary memory module cooling apparatus formed in accordance with an exemplary embodiment of the present invention.

FIG. 2 illustrates a memory cooling system 100 in accordance with an exemplary embodiment of the present invention. The cooling system 100 is disposed above the memory sockets 20 and the memory modules 12 installed in the sockets 20. The cooling system 100 includes a housing 102 having a body 104 extending between a first end 106 and a second end 108. The housing first end 106 is proximate the socket first end bracket 24 and the housing second end 108 is proximate the socket second bracket 26. A first fan 110 is housed at the housing first end 106 and a second fan 112 is housed at the housing second end 108. In an exemplary embodiment, the fans 110 and 112 are configured to direct or push air into the air gaps 16 in the directions of arrows B and C and also to draw or pull air from the air gaps 16 in the directions of arrows D and E. In FIG. 2, solid arrows B and D represent cooling air flow in a first air gap 16. Phantom arrows C and E represent cooling air flow in an adjacent air gap 16. Thus, in an exemplary embodiment, air flow in adjacent air gaps 16 is in opposite directions with respect to one another from the first end 38 to the second end 40 of the memory modules 12 so that one end of the memory modules 12 does not tend to run hotter than the opposite end. The memory module 12 also includes an on-board Advanced Memory Buffer (AMB) that is provided to coordinate high speed communications between the high speed memory modules 12 such as the DDR II and fully buffered DDR II memory modules, particularly in servers using stacked memory. The AMB's are heat generating and can produce hot spots on the memory module 12. The fans 110 and 112 can be positioned to direct cooling air toward the AMB, when present.

The body 104 extends along the longitudinal axis A of the socket base 22 interconnecting the housing first end 106 and second end 108. The body 104 acts as a cover over the memory modules 12 that inhibits movement of air from the air gaps 16 (see FIG. 1) in an upward direction parallel to the plane P of the memory module 12. The housing 102 has an overall length $L_1$ from the first end 106 to the second end 108 that does not exceed an overall length $L_2$ of the memory socket 20. Thus, the cooling system 100 fits within a footprint provided on the circuit board 14 for the memory sockets 20 and occupies no additional space.

Figure 3:
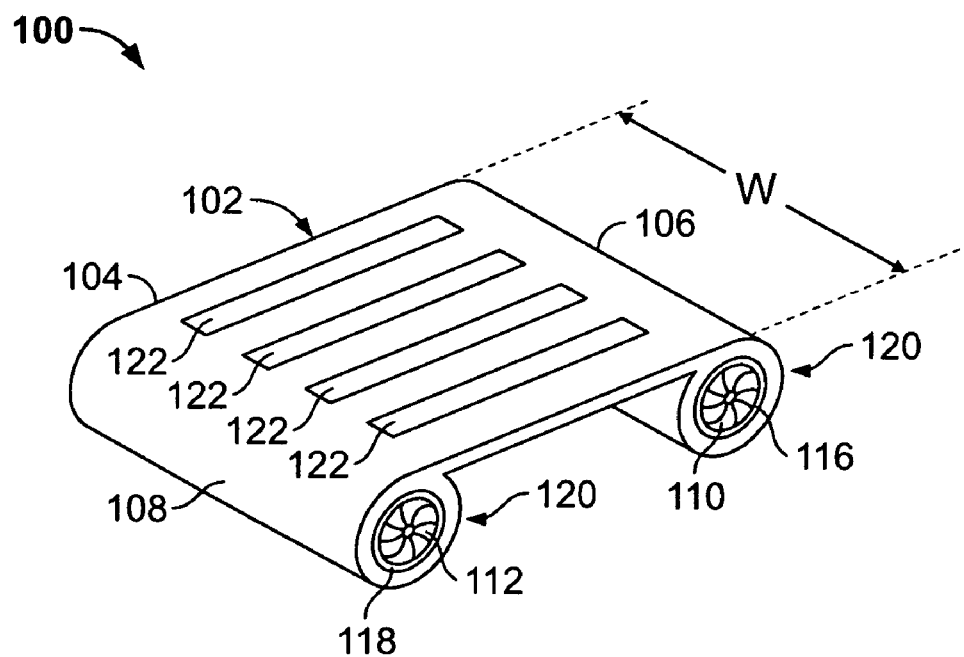
FIG. 3 is a perspective view of the memory module cooling apparatus shown in FIG. 2.

FIG. 3 illustrates a perspective view of the memory cooling system 100. The housing first end 106 includes a channel 116 that receives the first fan 110. Similarly, the housing second end 108 includes a channel 118 that receives the second fan 112. The channels 116 and 118 each extend along a width W of the housing 102 which is transverse to the longitudinal axis A of the memory sockets 20. The first and second fans 110 and 112, respectively are squirrel cage or radial type fans. The fans 110 and 112 take in cooling air at fan inlets 120 and expel the cooling air into the air gaps 16 between adjacent memory sockets 20 and memory modules 12. The housing body or cover 104 extends between the housing first end 106 and second end 108. In one embodiment, the body 104 is integrally formed with the housing first and second ends 106 and 108, respectively. Alternatively, the housing body 104 may be separable from the first and second ends 106 and 108. The memory cooling system 100 is intended for use with any type of memory module such as dual in line memory modules (DIMM), single end line memory modules (SIMM), and in particular with the newer and faster dual data rate II memory modules (DDR II) and fully buffered dual data rate II memory modules (FB DDR II). Standards for certain of these memory modules such as FB DDR II allow for memory modules 12 to be vertically stacked on top of one another. The housing body 104 includes a plurality of relief slots 122 to receive an upper edge of stacked memory modules.

Figure 4:
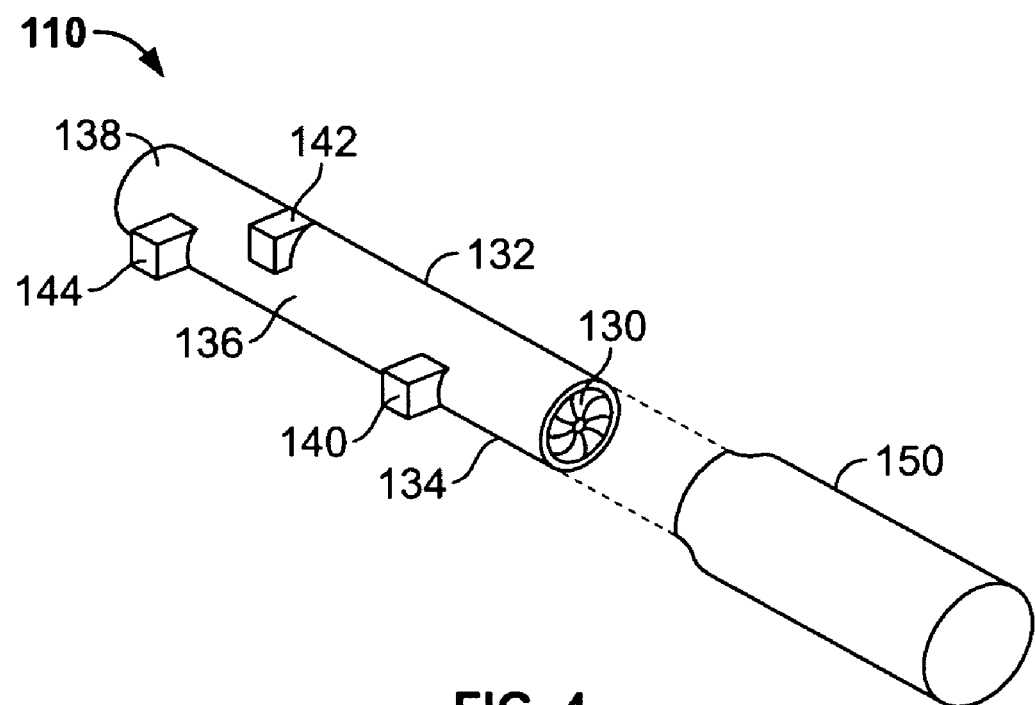
FIG. 4 is a perspective view of an exemplary fan formed in accordance with an exemplary embodiment of the present invention.

FIG. 4 illustrates a perspective view of an exemplary fan 110 used in the memory cooling system 100. The fan 110 includes a rotor or impeller 130 that is mounted within a fan casing 132. The fan 110 is a segmented unit that includes multiple stages 134, 136, and 138, some of which deliver cooling air to the air gaps 16, and others of which are configured to draw heated air from the air gaps 16. A port 140, 142, and 144 is provided on the fan casing 132 at each stage 134, 136, and 138 respectively. Each stage 134, 136, and 138 of the fan 110 is configured to either discharge cooling air into one of the air gaps 16 or draw in heated air from the air gap 16 through its respective port 140, 142, and 144. The fan 110 is positioned relative to the memory socket 20 so that each port 140, 142, 144 is aligned with an air gap 16 between adjacent memory modules 12. In operation, the fan 110 at stage 134 blows cooling air through port 140 into one air gap 16 while stage 136 draws air through port 142 from an adjacent air gap 16, and blows cooling air out through the third stage 138 at port 144. When installed on the memory sockets 20, the first fan 110 and second fan 112 (see FIG. 3) are positioned in the housing 102 at opposite ends of memory module 12. The first and second fans 110 and 112 are configured with respect to each other such that one fan 110, 112 has a port 140, 142, 144 that blows cooling air into one end of an air gap 16 and the other fan 110, 112 has a port 140, 142, 144 that draws heated air from the air gap 16 at the opposite end of the same air gap 16. In an adjacent air gap 16 the orientation of the ports 140, 142, 144 is reversed such that the first fan 110 draws air from the air gap 16 at one end and the second fan 112 blows air into the opposite end of the air gap 16. In this matter the cross flow of cooling air is achieved whereby cooling air flows through one air gap 16 in the a first direction and cooling air flows through an adjacent air gap 16 in a second direction opposite the first direction from the first end 38 of the memory modules 12 to the second end 40 of the memory modules 12.

In an alternative embodiment, the fans 110 and 112 are configured so that all of the fan stages 134, 136, and 138 for both fans 110 and 112 either blow cool or draw heated air. With this fan configuration, each air gap 16 has a fan port 140, 142, 144 only one end. For instance, a first air gap 16 has a fan port 140, 142, 144 on the right that blows cooling air, and no port on the left, the second air gap 16 has a fan port 140, 142, 144 on the left that blows cooling air, and no port on the right, and the third air gap 16 has a fan port 140, 142, 144 on the right that blows cooling air, and no port on the left, and so on. Air flow in adjacent air gaps 16 continues to alternate in direction from left to right and right to left in adjacent air gaps 16 but with air being pushed or pulled only from one end of the air gap 16.

In another embodiment, the fan stages 134, 136, and 138 may comprise separate fans. The cooling apparatus 100 may, in an exemplary embodiment, include an air duct 150 at the inlet of each fan 110 and 112 to supply cooling air from another part of the enclosure (not shown) or from outside the enclosure.

Figure 5:
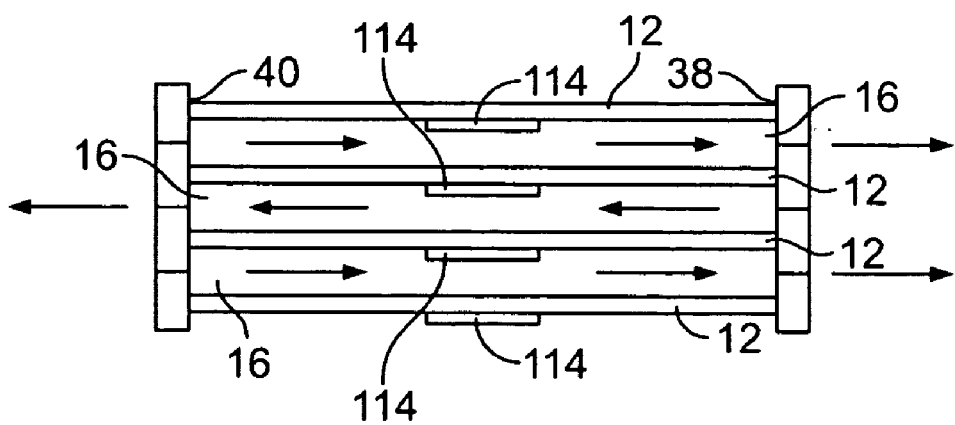
FIG. 5 is a top view of an exemplary memory interface illustrating cooling air flow.

FIG. 5 is a top view of an exemplary memory interface illustrating a cooling air flow pattern received with the memory cooling system 100. The housing 102 including the first and second fans 110 and 112, respectively are removed for clarity. Four memory modules 12, each including an AMB 114, are installed in the sockets 20. Three air gaps 16 are formed between adjacent memory modules 12. Air flow in the first air gap 16 is from left to right, from the second end 40 to the first end 38 of the memory modules 12, and can be either pushed from the left, pulled or drawn from the right, or simultaneously pushed from the left and drawn from the right depending on the configuration of the first and second fans 110 and 112 (see FIGS. 2 and 3). Similarly, air flow in the second, or middle air gap 16 is from right to left and is either blown or pushed from the right, drawn from the left, or simultaneously pushed from the right and drawn or pulled from the left depending on fan configuration. The third air gap 16 is the same as the first air gap 16 with air flow from left to right as described above.

The embodiments thus described provide a cooling system for memory modules that delivers cooling air through air gaps between adjacent memory modules. The air flow in adjacent air gaps is in opposite directions from one end of the memory modules to the opposite end of the memory modules so that one end of the memory modules will not tend to run hotter than the opposite end of the memory module. Cooling air is provided by radial or squirrel cage type fans mounted within a housing at opposite ends of the memory sockets. The fans have multiple stages, some of which blow cooling air into the air gaps and others of which draw the heated air from the air gaps. The housing includes a cover that inhibits the escape of cooling vertically from the air gap, or the escape of air in a direction parallel to the plane of the memory modules.

While the invention has been described in terms of various specific embodiments, those skilled in the art will recognize that the invention can be practiced with modification within the spirit and scope of the claims.

What is claimed is:

1. An apparatus for cooling memory modules installed in adjacent sockets on a circuit board, said apparatus comprising:
a fan for directing cooling air through air gaps between adjacent memory modules, said air gaps extending in a longitudinal direction from a first end of the modules to an opposite second end of the modules, said cooling air in adjacent air gaps moving in opposite directions from said first end of said memory modules to said second end of said memory modules.

2. The apparatus of claim 1, further comprising a housing disposed above the sockets, said housing having a first end proximate said first end of the memory modules and a second end proximate said second end of the memory modules.

3. The apparatus of claim 1, wherein said fan comprises a first fan proximate said first end of the memory modules and a second fan proximate said second end of the memory modules.

4. The apparatus of claim 1, wherein said fan has a plurality of stages extending along an axis transverse to said longitudinal direction of said air gaps, some of said stages delivering cooling air into said air gaps and others of said stages drawing air from said air gaps.

5. The apparatus of claim 1, wherein said fan comprises a first fan and a second fan, and said apparatus further comprises a housing disposed above the sockets, said housing having a first end proximate said first end of the memory modules and a second end proximate said second end of the memory modules, said first fan mounted in said first end of said housing and said second fan mounted in said second end of said housing.

6. The apparatus of claim 1, further comprising a housing disposed above the sockets, said housing having a first end proximate said first end of the memory modules, a second end proximate said second end of the memory modules, and a cover extending between said first and second ends of said housing, said cover inhibiting the escape of cooling from said air gaps in a direction parallel to the plane of the memory modules.

7. The apparatus of claim 1, further comprising a housing disposed above the sockets, said housing having a first end proximate said first end of the memory modules, a second end proximate said second end of the memory modules, and a cover extending between said first and second ends of said housing, said cover including a plurality of slots extending parallel to and aligned with the sockets to receive an upper portion of a stacked memory module installed in the sockets.

8. The apparatus of claim 1, further comprising a duct delivering cooling air to an inlet of said fan.

9. An apparatus for cooling memory modules installed in adjacent sockets on the circuit board, said apparatus comprising:

a housing having a first end and a second end and a body extending therebetween; and at least one fan mounted at one of said first and second ends of said housing, said at least one fan configured to deliver cooling air through air gaps between adjacent memory modules, said air gaps extending in a longitudinal direction from a first end of the memory modules to an opposite second end of the memory modules, said housing having a maximum length from said first end to said second end that does not exceed a maximum length of the sockets along a longitudinal axis of the sockets.

10. The apparatus of claim 9, wherein said at least one fan is configured to move cooling air in opposite directions through adjacent air gaps from said first end of the memory modules to said second end of the memory modules.

11. The apparatus of claim 9, wherein said housing body comprises a cover that inhibits the upward flow of cooling air from said air gaps in a direction parallel to the plane of the memory modules.

12. The apparatus of claim 9, wherein said housing body comprises a cover including a plurality of slots extending parallel to and aligned with the sockets to receive an upper portion of stacked memory modules installed in the sockets.

13. The apparatus of claim 9, wherein said at least one fan has a plurality of stages along a longitudinal axis transverse to said longitudinal direction of said air gaps, some of said stages delivering cooling air into said air gaps and others of said stages drawing air from said air gaps.

14. The apparatus of claim 9, wherein said at least one fan comprises a first fan proximate said first end of said housing and a second fan proximate said second end of said housing.

15. A socket for a memory module comprising:

a socket base comprising a plurality of slots extending between a first end of said base to an opposite second end of said base, each said slot configured to receive a memory module;

a housing coupled to said socket base, said housing having a first end proximate said first end of said socket base and a second end proximate said second end of said socket base; and a fan proximate one of said first and second ends of said socket base, said fan configured to direct cooling air longitudinally through air spaces between said slots, the cooling air in adjacent air spaces moving in opposite directions relative to one another from said first end of said socket base to said second end of said socket base.

16. The socket of claim 15, wherein said fan comprises a first fan proximate said first end of said socket base and a second fan proximate said second end of said socket base.

17. The socket of claim 15, wherein said fan has a plurality of stages along a longitudinal axis transverse to said longitudinal direction of said air spaces, some of said stages delivering cooling air into said air spaces and others of said stages drawing air from said air spaces.

18. The socket of claim 15, wherein said housing further comprising a cover extending between said first and second ends of said housing, said cover inhibiting the escape of cooling air vertically from said air spaces in a direction parallel to the plane of a memory module installed in said socket.

19. The socket of claim 15, wherein said housing further comprising a cover extending between said first and second ends of said housing, said cover including a plurality of slots extending parallel to and aligned with said slots in said sockets to receive an upper portion of a stacked memory module installed in said socket.

20. The socket of claim 15, further comprising a duct delivering cooling air to an inlet of said fan.

* * * * *